US012266530B2

(12) United States Patent
Rascuna' et al.

(10) Patent No.: US 12,266,530 B2
(45) Date of Patent: Apr. 1, 2025

(54) MANUFACTURING METHOD OF AN ELEMENT OF AN ELECTRONIC DEVICE HAVING IMPROVED RELIABILITY, AND RELATED ELEMENT, ELECTRONIC DEVICE AND ELECTRONIC APPARATUS

(71) Applicant: STMICROELECTRONICS S.r.l., Agrate Brianza (IT)

(72) Inventors: Simone Rascuna', Catania (IT); Mario Giuseppe Saggio, Aci Bonaccorsi (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 0 days.

(21) Appl. No.: 18/395,174

(22) Filed: Dec. 22, 2023

(65) Prior Publication Data

US 2024/0203737 A1   Jun. 20, 2024

Related U.S. Application Data

(62) Division of application No. 17/458,102, filed on Aug. 26, 2021, now Pat. No. 11,869,771.

(30) Foreign Application Priority Data

Sep. 4, 2020   (IT) .................. 102020000021058

(51) Int. Cl.
*H01L 29/66* (2006.01)
*H01L 21/04* (2006.01)
*H01L 29/16* (2006.01)

(52) U.S. Cl.
CPC ........ *H01L 21/045* (2013.01); *H01L 29/1608* (2013.01); *H01L 29/66053* (2013.01)

(58) Field of Classification Search
CPC ......... H01L 29/1608; H01L 29/66053–66068; H01L 29/0619; H01L 29/0623;
(Continued)

(56) References Cited

U.S. PATENT DOCUMENTS 5,182,226 A * 1/1993 Jang .................. H01L 21/26533
                                                438/440
6,656,758 B1  12/2003 Shinogi et al.
(Continued)

FOREIGN PATENT DOCUMENTS

EP    3144975 A1   3/2017
EP    3800660 A1   4/2021

OTHER PUBLICATIONS

Murase, "Dielectric Constant of Silicon Dioxide Deposited by Atmospheric-Pressure Chemical Vapor Deposition Using Tetraethylorthosilicate and Ozone," (Japanese Journal of Applied Physics, vol. 33, Issue 3A, pp. 1385 (1994); publication date Mar. 1994) (Year: 1994).

*Primary Examiner* — Eric A. Ward
(74) *Attorney, Agent, or Firm* — Seed IP Law Group LLP

(57) ABSTRACT

A manufacturing method of an anchorage element of a passivation layer, comprising: forming, in a semiconductor body made of SiC and at a distance from a top surface of the semiconductor body, a first implanted region having, along a first axis, a first maximum dimension; forming, in the semiconductor body, a second implanted region, which is superimposed to the first implanted region and has, along the first axis, a second maximum dimension smaller than the first maximum dimension; carrying out a process of thermal oxidation of the first implanted region and second implanted region to form an oxidized region; removing said oxidized region to form a cavity; and forming, on the top surface, the passivation layer protruding into the cavity to form said anchorage element fixing the passivation layer to the semiconductor body.

20 Claims, 6 Drawing Sheets

(58) Field of Classification Search
CPC ............... H01L 29/7811; H01L 21/045; H01L 21/265–266; H01L 21/76224–76237; H01L 29/66795–66818; H01L 29/785–7856; H01L 29/823431; H01L 29/823821; H01L 2029/7857; H01L 2029/7858

See application file for complete search history.

(56) References Cited

U.S. PATENT DOCUMENTS

| | | |
|---|---|---|
| 6,762,112 B2 | 7/2004 | Raineri et al. |
| 8,350,392 B2 | 1/2013 | Yanagisawa et al. |
| 10,020,373 B1 | 7/2018 | Kumakura et al. |
| 2002/0036290 A1* | 3/2002 | Inaba .................... H01L 29/785 257/365 |
| 2003/0003680 A1 | 1/2003 | Raineri et al. |
| 2004/0211980 A1* | 10/2004 | Ryu .................... H01L 29/7828 257/E29.104 |
| 2005/0139952 A1* | 6/2005 | Koh .................. H01L 21/76232 257/E21.549 |
| 2006/0255478 A1 | 11/2006 | Hagen et al. |
| 2010/0207281 A1 | 8/2010 | Su et al. |
| 2010/0258869 A1* | 10/2010 | Morita ................... H01L 21/84 257/E21.414 |
| 2011/0207323 A1 | 8/2011 | Ditizio |
| 2013/0069109 A1 | 3/2013 | Matsuda et al. |
| 2015/0041828 A1 | 2/2015 | Nagao |
| 2015/0333190 A1 | 11/2015 | Aketa et al. |
| 2016/0079428 A1* | 3/2016 | Zhao ................... H01L 29/7853 438/150 |
| 2016/0093748 A1 | 3/2016 | Mieczkowski et al. |
| 2017/0084687 A1 | 3/2017 | Grivna et al. |
| 2017/0110545 A1 | 4/2017 | Nagao et al. |
| 2017/0162679 A1 | 6/2017 | Schmidt |
| 2018/0212071 A1 | 7/2018 | Mihaila et al. |
| 2020/0279921 A1 | 9/2020 | Shiomi |
| 2021/0066150 A1 | 3/2021 | Nakata |
| 2021/0104445 A1 | 4/2021 | Rascuna' et al. |
| 2023/0092543 A1 | 3/2023 | Rascuna' et al. |
| 2023/0170271 A1 | 6/2023 | Puglisi et al. |

\* cited by examiner

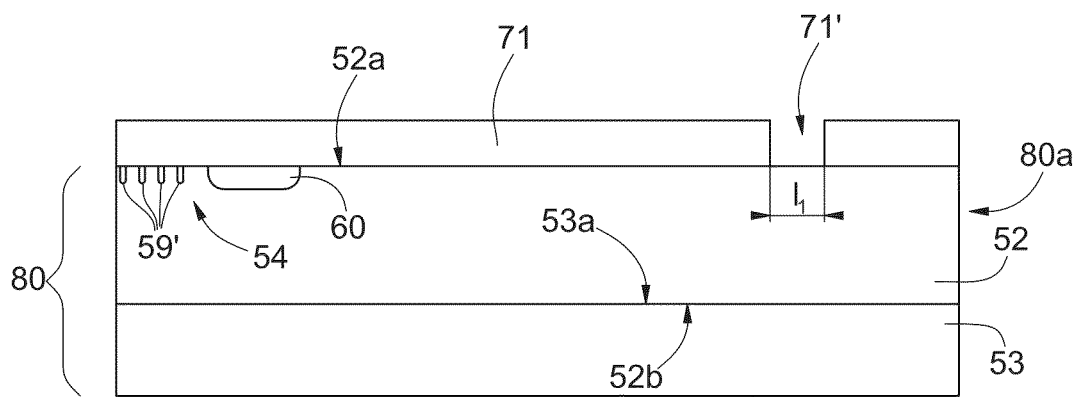
FIG. 4A
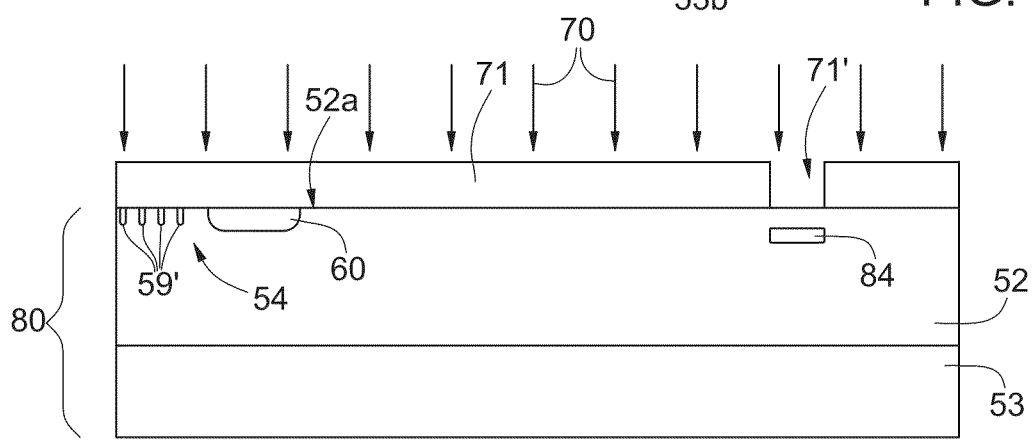
FIG. 4B
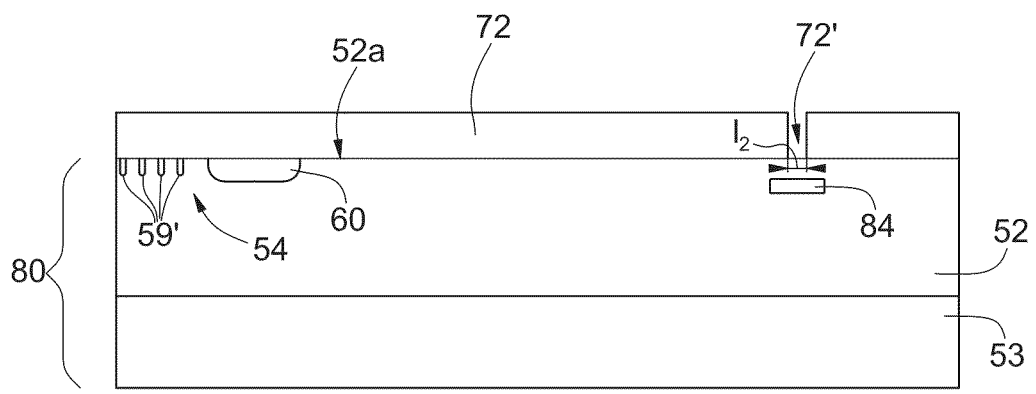
FIG. 4C
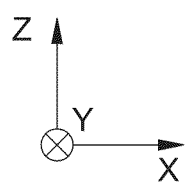

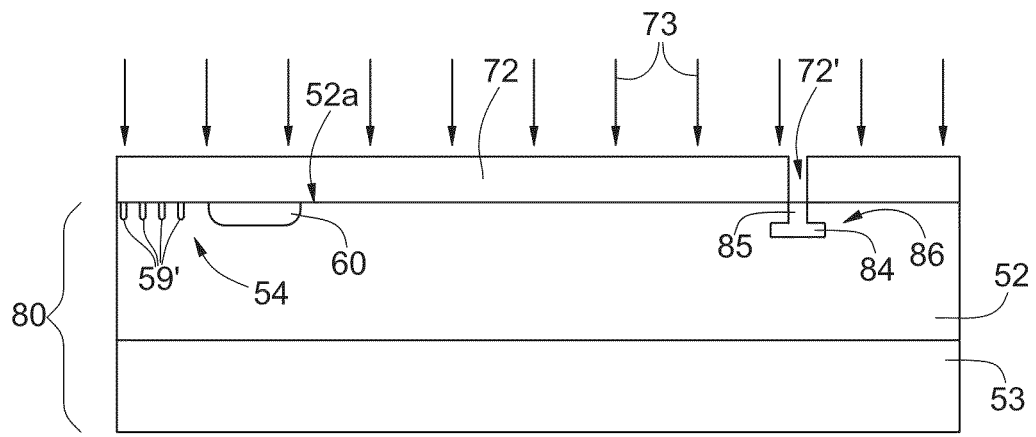
FIG. 4D
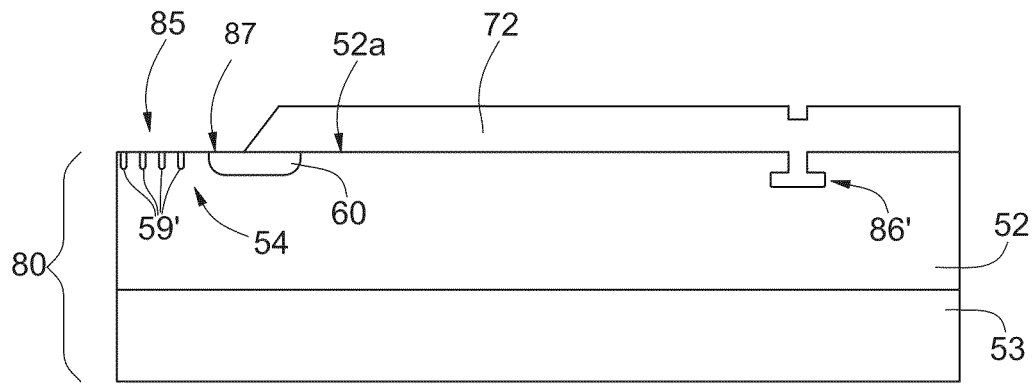
FIG. 4E
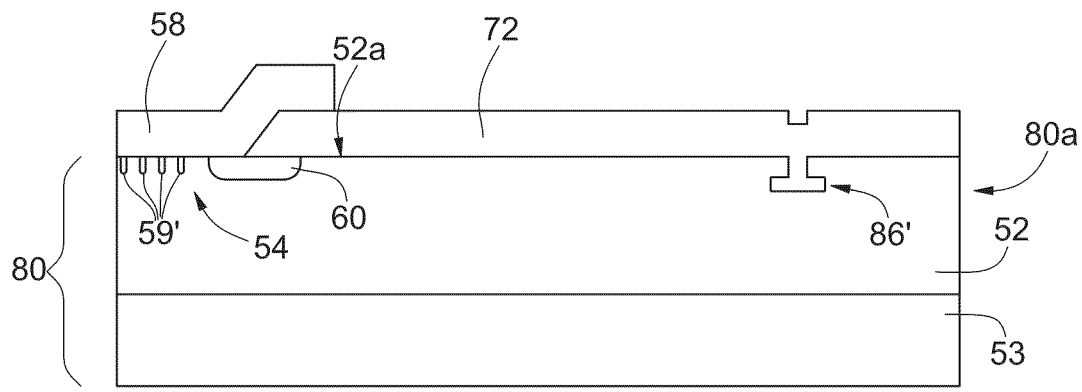
FIG. 4F
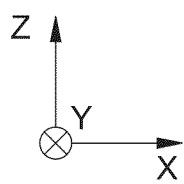

MANUFACTURING METHOD OF AN ELEMENT OF AN ELECTRONIC DEVICE HAVING IMPROVED RELIABILITY, AND RELATED ELEMENT, ELECTRONIC DEVICE AND ELECTRONIC APPARATUS

BACKGROUND

Technical Field

The present is directed to a manufacturing method of an anchorage element of an electronic device, to an anchorage element, to an electronic device and to an electronic apparatus. The present is directed to an anchorage element adapted to improve the reliability of silicon-carbide (SiC) electronic power devices during thermal cycling tests.

Description of the Related Art

As is known, semiconductor materials that have a wide band gap (e.g., that have an energy value $E_g$ of the band gap greater than 1.1 eV), low ON-state resistance ($R_{ON}$), a high value of thermal conductivity, a high operating frequency, and a high saturation velocity of charge carriers, are utilized for producing electronic components, such as diodes or transistors, in particular for power applications. A material having such features, and designed to be used for manufacturing electronic components, is silicon carbide (SIC). In particular, silicon carbide, in its various polytypes (for example, 3C—SiC, 4H—SiC, 6H—SiC), is preferable to silicon in regards to the properties listed previously.

Electronic devices provided on a silicon-carbide substrate, as compared to similar devices provided on a silicon substrate, have numerous advantages, such as low ON-state output resistance, low leakage current, high output power, high operating temperature and high operating frequencies.

However, development and manufacture of SiC-based electronic devices are limited by factors such as the electrical and mechanical properties of passivation layers (which are comprised in said electronic devices and extend, for example, over SiC semiconductor bodies of the electronic devices). In particular, it is known to provide passivation layers using polymeric materials (e.g., polyimide), which make it possible to withstand high operating temperatures of the electronic devices and have high dielectric strength, for example, higher than 400 kV/mm. In detail, the high dielectric strength of the polymeric materials guarantees that the passivation layers will withstand high electrical fields, and consequently high potential differences across them, without undergoing electrical breakdown, and therefore without becoming electrically conductive.

However, polymeric materials have high coefficients of thermal expansion (CTEs) (e.g., CTE=$43e^{-6}$ 1/K for the material polybenzobisoxazole—PIX), and this causes problems of adhesion of the passivation layer to the SiC, which has a lower coefficient of thermal expansion (CTE=$3.8e^{-6}$ 1/K).

In particular, the above problems of adhesion between the passivation layer and the SiC may arise during thermal cycling tests (carried out, for example, between approximately −50° C. and approximately +150° C.) or during use of the electronic device, when the latter is subjected to large temperature variations (e.g., it is subjected to differences of operating temperature equal to, or greater than, approximately 200° C.). On account of the large difference in CTE between the passivation layer and the SiC, said large temperature variations generate mechanical stresses at an interface between the passivation layer and the SiC, which can lead to a (at least partial) delamination of the passivation layer with respect to the SiC semiconductor body.

In the case where said delamination is sufficiently extensive (e.g., if it were such that there is no longer any portion of the passivation layer interposed between two metallizations of the electronic device at different potentials, which are therefore separated from one another just by air), electrical discharges can generate at this interface, leading to damage to the electronic device itself. In particular, the risk of damage to the electronic device increases when the latter is used in reverse-biasing conditions, on account of the high-voltage difference (e.g., greater than 1000 V) to be withstood.

Known solutions to the above problem comprise the use of a plurality of dielectric layers of materials that are different from one another (e.g., silicon nitride, silicon oxide and polyimide in succession) to form a passivation multilayer adapted to limit the mechanical stresses at the interface with the SiC semiconductor body. However, these solutions prove ineffective when the electronic devices are subjected to large temperature variations and to high voltage differences in reverse-biasing conditions.

BRIEF SUMMARY

The present disclosure provides a manufacturing method of an anchorage element of an electronic device, an anchorage element, an electronic device and an electronic apparatus that will overcome the drawbacks of the known art.

In at least one embodiment of the present disclosure, a device, includes a semiconductor body including silicon carbide (SiC). A passivation layer extends over a first surface of the semiconductor body and has a first anchorage element protruding into a first cavity in the semiconductor body at the first surface. The first anchorage element fixes the passivation layer to the semiconductor body, the first anchorage element includes: a first portion in the semiconductor body at a first distance from the first surface in a first direction transverse to the first surface, and the first portion having a maximum first dimension in a second direction transverse to the first direction; and a second portion being superimposed with the first portion, extending in the semiconductor body from the first surface to the first portion, and having a second maximum dimension in a second direction and smaller than the first dimension, the second portion being closer to the first surface than the first portion.

In at least one embodiment of the present disclosure, a device includes a semiconductor body. A first anchorage element of a passivation layer that protrudes into a first surface of the semiconductor body, the passivation layer extends on the first surface of the semiconductor body and protrudes into a first cavity in the semiconductor body and the first surface. The first anchorage element includes: a first portion in the semiconductor body at a first distance from the first surface in a first direction transverse to the first surface, and the first portion having a first dimension in a second direction transverse to the first direction; and a second portion being superimposed with the first portion, extending in the semiconductor body from the first surface to the first portion in the first direction, and a having a second dimension in the second direction smaller than the first dimension, the second portion being closer to the first surface than the first portion, wherein the first anchorage element fixes the passivation layer to the semiconductor body.

DESCRIPTION OF THE SEVERAL VIEWS OF THE DRAWINGS

For a better understanding of the present disclosure, a preferred embodiment is now described, purely by way of non-limiting example, with reference to the attached drawings, wherein:

FIGS. 4A-4H show, in cross-sectional view, respective manufacturing steps of the electronic device of FIG. 1, according to an embodiment of the present disclosure.

DETAILED DESCRIPTION

Elements that are common to the various embodiments of the present disclosure, described in what follows, are indicated with the same reference numbers.

Figure 1:
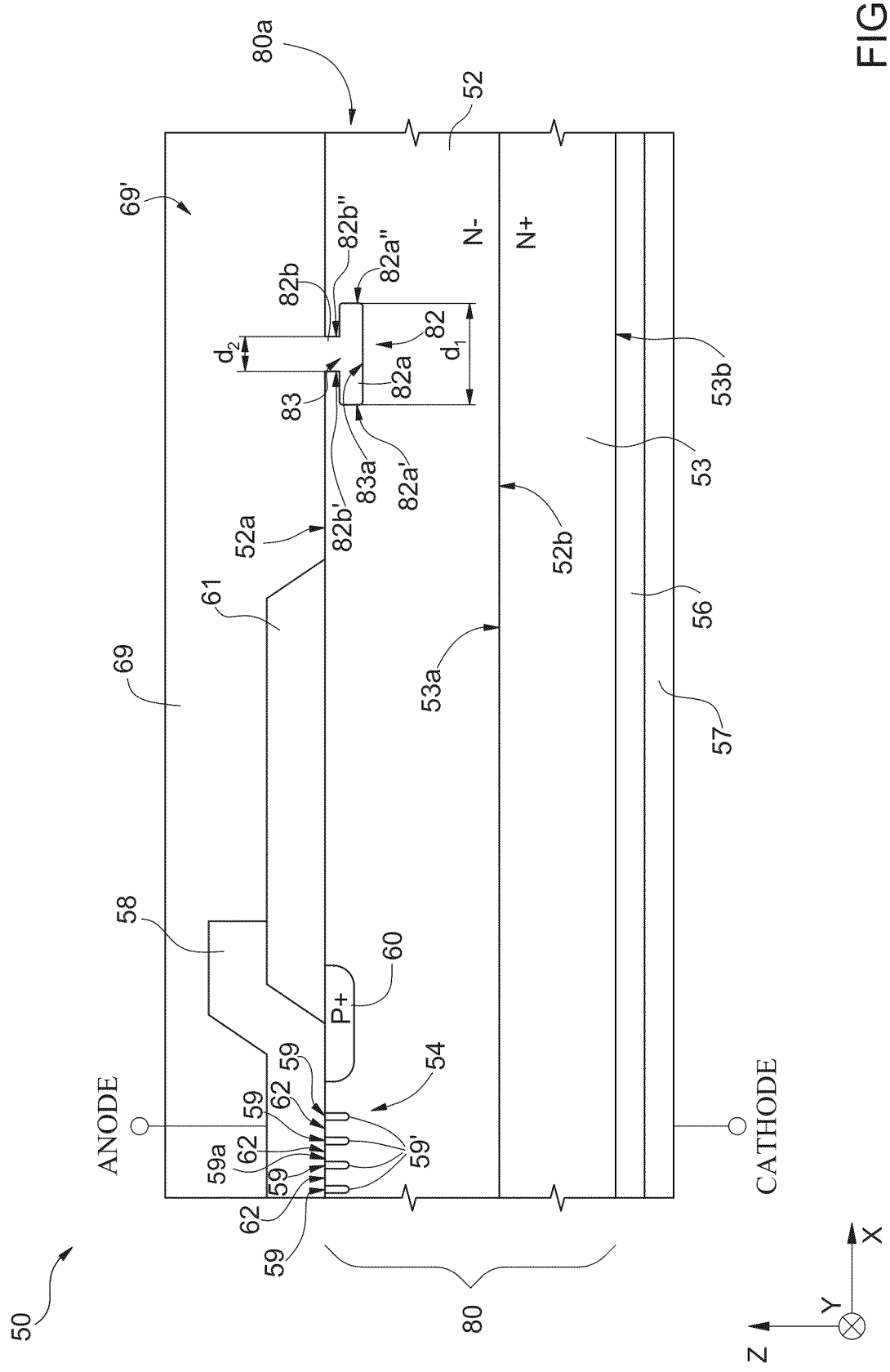
FIGS. 1 and 2 show, in cross-sectional view, an electronic device according to respective embodiments of the present disclosure.

FIG. 1 shows, in lateral sectional view in a (triaxial) cartesian reference system of axes X, Y, Z, an electronic device (in detail, a merged-PiN-Schottky, MPS, device or junction-barrier Schottky, JBS, device) 50 according to an aspect of the present disclosure. In particular, the MPS device 50 is shown in FIG. 1 in a plane XZ defined by the axes X and Z, and is comprised in an electronic apparatus (not shown, such as a notebook, a mobile phone, a photovoltaic system, a traction inverter for electrical vehicles, etc.).

The MPS device 50 includes: a substrate 53, of SiC of an N type, having a first dopant concentration, provided with a surface 53a opposite to a surface 53b, and having a thickness between the surfaces 53a and 53b comprised, for example, between 50 μm and 350 μm, more in particular between 160 μm and 200 μm, for example, 180 μm; a drift layer (grown in an epitaxial way) 52, of SiC of an N type, having a second dopant concentration lower than the first dopant concentration and having a top surface 52a and a bottom surface 52b opposite to one another, the drift layer 52 extending over the surface 53a of the substrate 53 (in detail, the surfaces 53a and 52b are in contact with one another) and having a thickness between the surfaces 52a and 52b comprised, for example, between 5 and 15 μm; an ohmic-contact region, or layer 56 (for example, of nickel silicide), which extends on and along the surface 53b of the substrate 53; a cathode metallization 57, for example, of Ti/NiV/Ag or Ti/NiV/Au, which extends on and along the ohmic-contact region 56; at least one doped region 59' of a P type in the drift layer 52, exposed from and at the top surface 52a of the drift layer 52 and, for each doped region 59', a respective ohmic contact (not shown and of a known type; for example, each ohmic contact extends in depth, along the axis Z, within the respective doped region 59' starting from the top surface 52a for a depth comprised between one nanometer and some tens of nanometers, measured starting from the top surface 52a, so as to be physically isolated from the drift layer 52 by the doped region 59') so that each doped region 59' will form a respective junction-barrier (JB) element 59 with the drift layer 52; an edge-termination region, or protection ring, 60, in particular a further doped region of a P type, which extends in the drift layer 52 exposed from and at the top surface 52a of the drift layer 52 and completely surrounds (parallelly to a plane XY defined by the axes X and Y) the JB elements 59; an insulating layer 61 (optional), which extends over the top surface 52a of the drift layer 52 so as to completely surround (parallelly to the plane XY) the JB elements 59 and so as to overlap at least partially the protection ring 60; an anode metallization 58, for example, of Ti/AlSiCu or Ni/AlSiCu, which extends over a first portion of the top surface 52a, delimited on the outside by the insulating layer 61, and which moreover optionally extends partially over the insulating layer 61; and a passivation layer 69 of polymeric material such as polyimide (e.g., PIX), which extends over the anode metallization 58, over the insulating layer 61, and over a second portion of the top surface 52a that is not aligned with either the anode metallization 58 or the insulating layer 61.

One or more Schottky diodes 62 are formed at the interface between the drift layer 52 and the anode metallization 58, alongside the doped regions 59'. In particular, (semiconductor-metal) Schottky junctions are formed by portions of the drift layer 52 in direct electrical contact with respective portions of the anode metallization 58.

In addition, each ohmic contact extending in the respective doped region 59' provides an electrical connection having a value of electrical resistivity lower than the value of electrical resistivity of the doped region 59' that houses each ohmic contact. The JB elements 59 are therefore P-i-N diodes formed by the doped regions 59', by the drift layer 52 and by the substrate 53.

The region of the MPS device 50 that includes the JB elements 59 and the Schottky diodes 62 (i.e., the region delimited on the outside by the protection ring 60) is an active area 54 of the MPS device 50.

The substrate 53 and the drift layer 52 form a semiconductor body 80 of the MPS device 50.

Externally to the active area 54, and at a distance (along the axis X) from the insulating layer 61, a lateral surface 80a of the semiconductor body 80 is present, which extends, for example, in a direction substantially transverse (e.g., orthogonal) to the top surface 52a of the drift layer 52. The lateral surface 80a is provided during manufacture of the MPS device 50, and in particular during dicing of an SiC wafer where the MPS device 50 is provided. In other words, the lateral surface 80a is provided at a scribe line (not shown) of the SiC wafer from which the MPS device 50 is made; said scribe line surrounds at a distance, in the plane XY, the active region 54, the protection ring 60, and the insulating layer 61.

The passivation layer 69 moreover has an anchorage element 82, which protrudes and extends into the drift layer 52, beyond the top surface 52a, so as to anchor and fix the passivation layer 69 to the semiconductor body 80.

The anchorage element 82 is interposed, parallelly to the axis X, between the active region 54 and the lateral surface 80a (in greater detail, between the insulating layer 61 and the lateral surface 80a).

The anchorage element 82 is shaped so as to fix the passivation layer 69 to the semiconductor body 80 (in particular, to the drift layer 52) and is adapted to prevent delamination and detachment, at the active area 54, of the passivation layer 69 with respect to the semiconductor body 80.

In particular, the anchorage element 82 is housed and arranged by interlocking into a cavity 83, which extends in the drift layer 52 starting from the top surface 52a, so as to couple and jointly fixing with respect to one another the passivation layer 69 and the semiconductor body 80. The cavity 83 is delimited on the outside by a wall 83a of the drift layer 52, having a shape complementary to a shape of the anchorage element 82.

In particular, the anchorage element 82 comprises a plurality of portions (in particular, a first portion and a second portion 82a, 82b in FIG. 1), which are arranged in succession with respect to one another along the axis Z and have respective dimensions, measured parallelly to the axis X, that increase in a direction away from the top surface 52a (and therefore, towards the bottom surface 52b).

In detail, with reference to the embodiment of FIG. 1, the passivation layer 69 comprises a main body 69' (which extends over the top surface 52a of the drift layer 52, over the insulating layer 61, and over the anode metallization 58) and the anchorage element 82 (which extends in the drift layer 52). Said second portion 82b is interposed, parallelly to the axis Z, between the main body 69' of the passivation layer 69 and the first connection portion 82a. In other words, the first portion 82a is at a distance (e.g., measured parallelly to the axis Z starting from a centroid of the first portion 82a) from the bottom surface 52b of the drift layer 52 that is less than a distance (e.g., measured parallelly to the axis Z starting from a respective centroid of the second portion 82b) of the second portion 82b from said bottom surface 52b. In other words, the second portion 82b is closer to the surface 52b relative to the first portion 82a. The first portion 82a has a first maximum dimension measured parallelly to the axis X and having a first value $d_1$, and the second portion 82b has a second maximum dimension measured parallelly to the axis X and having a second value $d_2$ that is smaller than the first value $d_1$. In detail, the first value $d_1$ is measured parallelly to the axis X between surfaces 82a' and 82a" of the first portion 82a opposite to one another along the axis X, and the second value $d_2$ is measured parallelly to the axis X between surfaces 82b' and 82b" of the second portion 82b opposite to one another along the axis X.

In FIG. 1, the first and the second portions 82a, 82b each have, in the plane XZ, a substantially rectangular shape (alternatively, each have a polygonal shape, such as an oval shape), with respective major sides arranged so as to be parallel to the axis X and with respective minor sides (i.e., the surfaces 82a', 82a", 82b', 82b") arranged so as to be parallel to the axis Z; the two rectangular shapes are joined together at two of said major sides (in greater detail, between one of the major sides of the first portion 82a and one of the major sides of the second portion 82b, which face one another and are in contact with one another). In other words, the anchorage element 82 is substantially T-shaped, with a minor base at the top surface 52a and a major base facing the bottom surface 52b.

Figure 2:
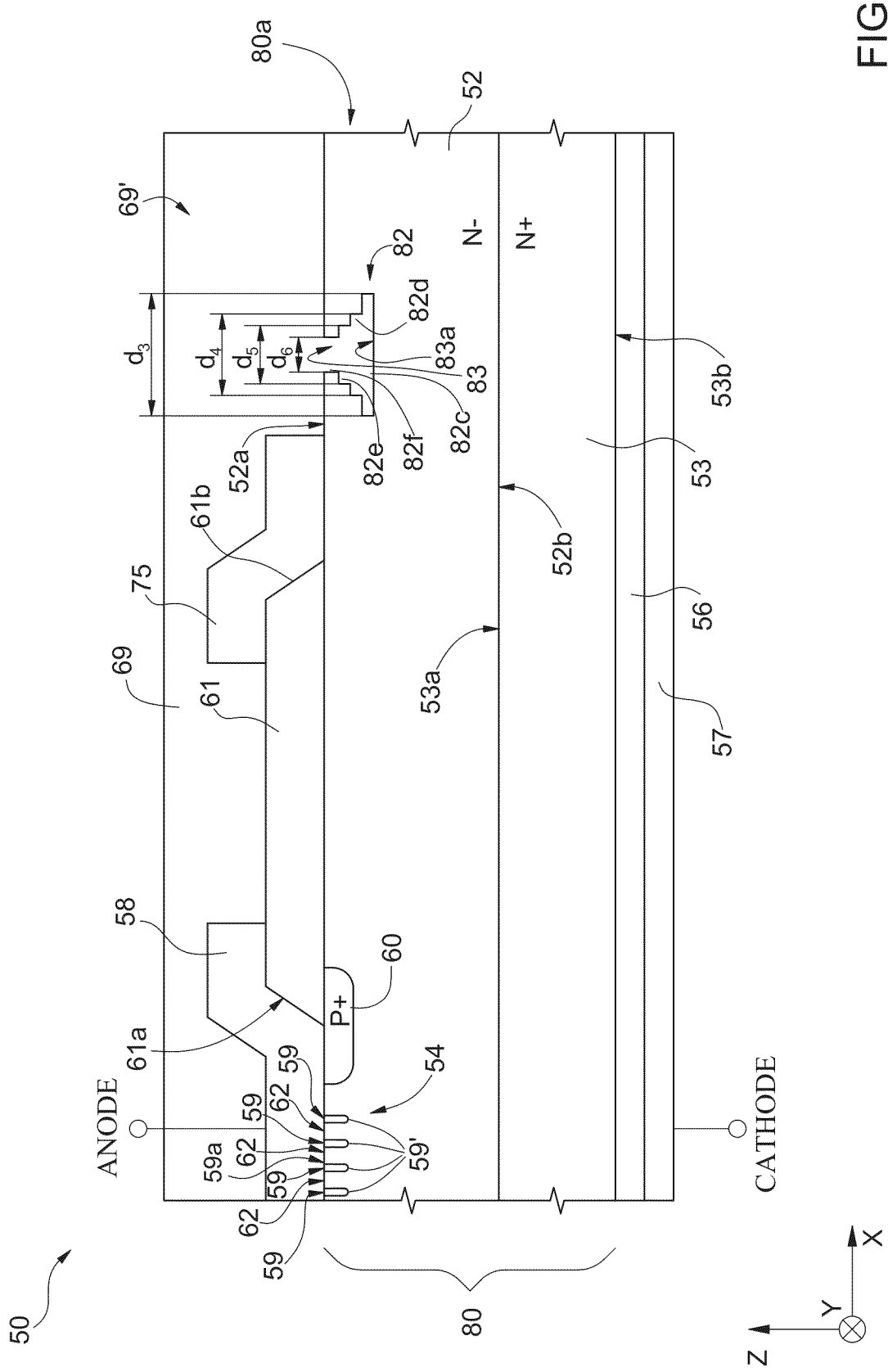

According to a different embodiment of the MPS device 50 shown in FIG. 2, the anchorage element 82 has a greater number of portions than the MPS device 50 of FIG. 1 (in particular, it has four portions 82c-82f in FIG. 2). The portions 82c-82f are similar to the portions 82a, 82b and have, respectively, dimensions $d_3$-$d_6$ measured parallelly to the axis X, with $d_3 > d_4 > d_5 > d_6$. In other words, the anchorage element 82 has a substantially pyramidal shape (in particular, that of a stepped truncated pyramid), with a minor base at the top surface 52a and a major base facing the bottom surface 52b.

In addition, optionally, the MPS device 50 comprises an equipotential-ring (EQR) metallization 75 (shown by way of example in FIG. 2) extending over the insulating layer 61 and, optionally, on the top surface 52a so as to be opposite, parallelly to the axis X, to the anode metallization 58 with respect to the insulating layer 61. In detail, in FIG. 2 the insulating layer 61 has surfaces 61a and 61b opposite to one another in a direction parallel to the axis X; the anode metallization 58 extends from the surface 61a, and the EQR metallization 75 extends from the surface 61b. For instance, in a top view and parallelly to the plane XY, the EQR metallization 75 extends externally to the insulating layer 61 and the active region 54, so as to surround the insulating layer 61. In addition, the EQR metallization 75 and the anode metallization 58 are physically and electrically separated from one another by the passivation layer 69. In use, the EQR metallization 75 is set at the same voltage as the cathode metallization 57.

Figure 3B:
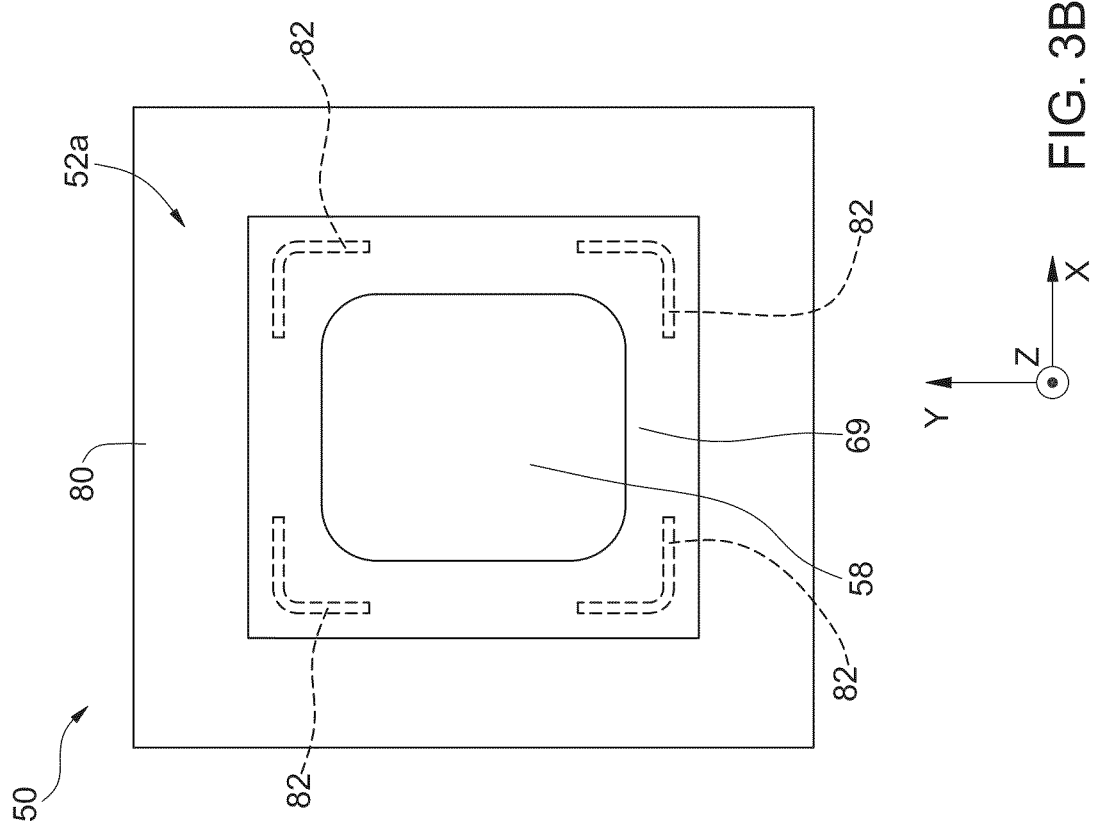
FIGS. 3A and 3B show, in top view, the electronic device of FIG. 1 according to respective embodiments of the present disclosure.
Figure 3A:
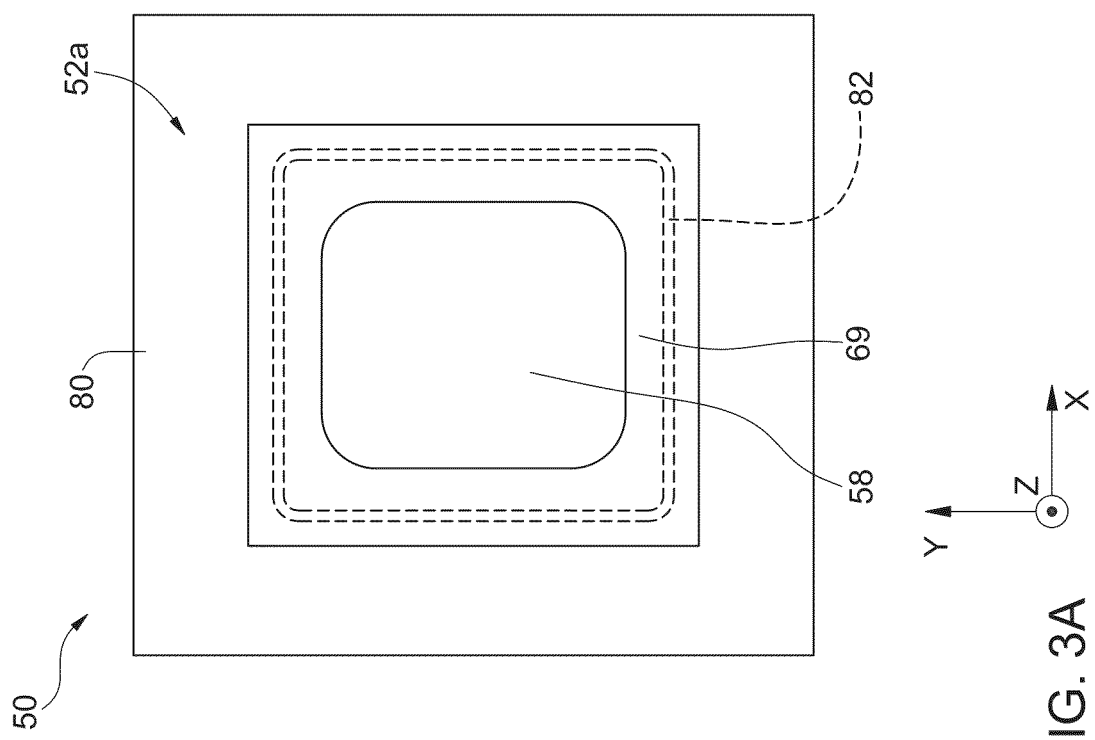

FIGS. 3A and 3B show the MPS device 50 in top view (parallelly to the plane XY), according to respective embodiments.

With reference to FIG. 3A, the anchorage element 82 extends in the plane XY so as to surround the anode metallization 58 completely. In the view in the plane XY of FIG. 3A, the anchorage element 82 is annular and defines a closed polygonal shape, and more in particular a square shape with chamfered corners (even though different shapes are also possible, such as circular, rectangular or triangular).

With reference to FIG. 3B, the MPS device 50 comprises at least one further anchorage element (similar to the anchorage element 82 and therefore indicated with the same reference number). The anchorage element 82 and the at least one further anchorage element 82 extend at a distance from one another at the top surface 52a, i.e., they extend in respective areas of the top surface 52a separate from one another. For instance, the view in the plane XY of FIG. 3B shows four anchorage elements 82 arranged around the anode metallization 58 so as to be angularly equispaced with respect to the anode metallization 58, and in greater detail arranged at corners of a square shape with chamfered corners of the anode metallization 58.

The manufacturing steps of the MPS device 50 of FIG. 1 are described in what follows, with reference to FIGS. 4A-4H.

With reference to FIG. 4A, a wafer is arranged including the substrate 53 of SiC (in particular 4H—SiC, however other polytypes may be used, such as, though not exclusively, 2H—SiC, 3C—SiC and 6H—SiC). For instance, the substrate 53 has a concentration of dopants of an N type comprised between $1 \cdot 10^{19}$ at/cm$^3$ and $1 \cdot 10^{22}$ at/cm$^3$, and has a thickness, measured along the axis Z between the surfaces 53a and 53b, comprised between 300 μm and 450 μm, and in particular of approximately 360 μm. Formed on the surface 53a of the substrate 53, for example by means of epitaxial growth, is the drift layer 52. The drift layer 52 is of SiC, in particular 4H—SiC, but it is possible to use other SiC polytypes, such as 2H, 6H, 3C, or 15R. The drift layer 52 and the substrate 53 form the semiconductor body 80. In the drift layer 52 there are then formed, according to known techniques and at the top surface 52a, the doped regions 59' with the respective ohmic contacts, and the protection ring 60. In addition, a first hard mask 71 is formed on the top surface 52a of the drift layer 52, obtained, for example, by deposition of a photoresist, or tetraethoxysilane (TEOS), or another material designed for the purpose. The first hard mask 71 has a thickness of between 0.5 μm and 2 μm or in any case a thickness such as to shield the implantation described hereinafter with reference to FIG. 4B. The first hard mask 71 extends over the top surface 52a so as to leave exposed, in top view in the plane XY, a first region 71' of the semiconductor body 80 where, in subsequent steps, the anchorage element 82 will be formed. In detail, the first region 71' overlaps, parallelly to the axis Z, the region of the drift layer 52 where, in subsequent steps, the first portion 82a of the anchorage element 82 will be formed. The first region 71' extends, parallelly to the axis X, between the protection ring 60 and the lateral surface 80a of the semiconductor body 80 and has a first maximum width 11, measured parallelly to the axis X, which is equal to, or approximately equal to, the first value $d_1$.

With reference to FIG. 4B, a step of high-energy implantation of dopant species (having conductivity of a P or N type, such as boron, arsenic or aluminum) is then carried out, exploiting the first hard mask 71 (the implantation is represented in the figure by the arrows 70). In an embodiment provided by way of example, the implantation step 70 comprises one or more implantations of dopant species, with implantation energy comprised between 200 keV and 500 keV and with doses of between $1 \cdot 10^{12}$ at/cm$^2$ and $1 \cdot 10^{16}$ at/cm$^2$, to form a first implanted region 84 having a dopant concentration higher than $1 \cdot 10^{18}$ at/cm$^3$ and having a depth, measured starting from the top surface 52a, comprised between 0.4 µm and 1 µm. The first implanted region 84 therefore extends in depth into the drift layer 52, at a distance (parallelly to the axis Z) from the top surface 52a. The first hard mask 71 is then removed, leaving the top surface 52a exposed.

With reference to FIG. 4C, on the top surface 52a of the drift layer 52 a second hard mask 72 is formed, for example by deposition of a photoresist, or TEOS, or another material designed for the purpose. The second hard mask 72 has a thickness of between 0.5 µm and 2 µm or in any case a thickness such as to shield the implantation described hereinafter with reference to FIG. 4D. The second hard mask 72 extends over the top surface 52a so as to leave exposed, in the top view in the plane XY, a second region 72' of the semiconductor body 80 where, in subsequent steps, the second portion 82b of the anchorage element 82 will be formed. The second region 72' overlaps, parallelly to the axis Z, the first implanted region 84 and has a second maximum width 12, measured in a direction parallel to the axis X, that is less than the first width 11 and is equal to, or approximately equal to, the second value $d_2$.

With reference to FIG. 4D, a step of low-energy implantation of dopant species (having the same conductivity as the implantation step 70) is then carried out, exploiting the second hard mask 72 (the implantation is indicated in the figure by the arrows 73). In an embodiment provided by way of example, the implantation step 73 comprises one or more implantations of dopant species, with implantation energy comprised between 30 keV and 200 keV and with doses of between $1 \cdot 10^{12}$ at/cm$^2$ and $1 \cdot 10^{16}$ at/cm$^2$, to form a second implanted region 85 at the top surface 52a, having a dopant concentration higher than $1 \cdot 10^{18}$ at/cm$^3$ and having a maximum depth, measured starting from the top surface 52a, comprised between 0.4 µm and 1 µm. The second implanted region 85 therefore extends starting from the top surface 52a until the first implanted region 84 is reached; the first and second implanted regions 84 and 85 therefore join together to form an implanted anchorage region 86 having a shape that is the same as the shape of the anchorage element 82.

With reference to FIG. 4E, at the second hard mask 72 and at the implanted anchorage region 84, a step of thermal oxidation is carried out in order to oxidize the implanted anchorage region 86, transforming the latter into silicon oxide ($SiO_2$) and forming a corresponding oxidized anchorage region 86' coincident with the implanted anchorage region 86. In fact, it has been shown that the oxidation rate of SiC increases the more the crystal lattice of the SiC is damaged, for example by implantation of dopant species.

Consequently, the implanted anchorage region 86 is oxidized during the oxidation step, whereas the drift layer 52 (further protected due to the presence of the second hard mask 72) does not substantially undergo oxidation. The step of thermal oxidation is, for example, carried out at a temperature higher than, or equal to, 1000° C. (for example, between 1150° C. and 1250° C.) for a time comprised between 60 and 300 min.

Moreover, with reference to FIG. 4E, etching (not shown) of the second hard mask 72 is carried out to selectively remove a portion of the second hard mask 72 so as to expose the active area 54. In detail, said etching exposes the portion of the top surface 52a delimited on the outside, in the plane XY, by the protection ring 60 (i.e., the portion of the top surface 52a comprising the doped regions 59' and part of the protection ring 60, identified in what follows as first portion 87) and, at least partially, the protection ring 60.

With reference to FIG. 4F, the anode metallization 58 is formed on the first portion 87 of the top surface 52a exposed by the etch of FIG. 4E and on part of the second hard mask 72. Consequently, the anode metallization 58 contacts the doped regions 59' (by the respective ohmic contacts) and the drift layer 52 so as to form the JB elements 59 and, respectively, the Schottky diodes 62; moreover, the anode metallization 58 extends over the part of the protection ring 60 exposed by the etch of FIG. 4E and over the second hard mask 72 at the protection ring 60. For instance, the anode metallization 58 is formed by deposition of Ti/AlSiCu or Ni/AlSiCu.

Figure 4G:
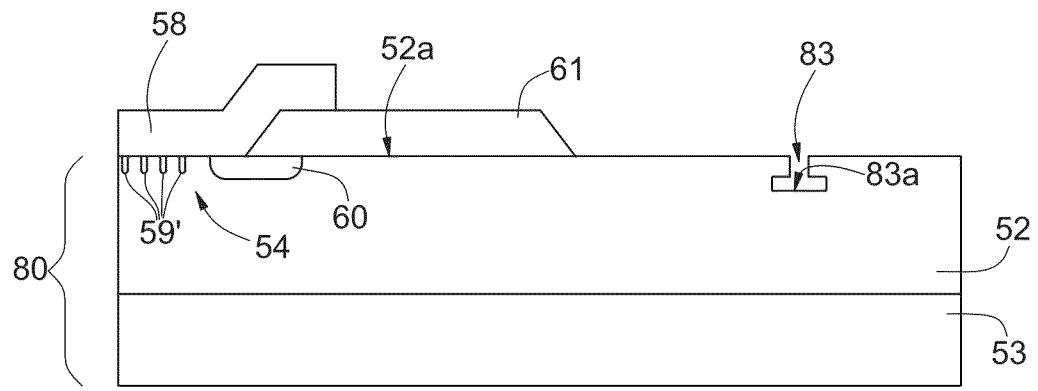

With reference to FIG. 4G, a further etching (not shown) of the second hard mask 72 is carried out to remove a further portion of the second hard mask 72 (which is placed at the oxidized anchorage region 86' and moreover extends between the oxidized anchorage region 86' and the lateral surface 80a of the semiconductor body 80) and the oxidized anchorage region 86' so as to form the cavity 83. In detail, the wall 83a of the drift layer 52, which is exposed by the etch due to removal of the oxidized anchorage region 86' and which delimits the cavity 83, has a shape complementary to the shape of the oxidized anchorage region 86', and therefore to the shape of the anchorage element 82. In addition, the region of the second hard mask 72 that is not removed by said etch forms said insulating layer 61 of the MPS device 50. The etch of FIG. 4G is of an isotropic type, and is carried out by hydrofluoric acid—HF.

Figure 4H:
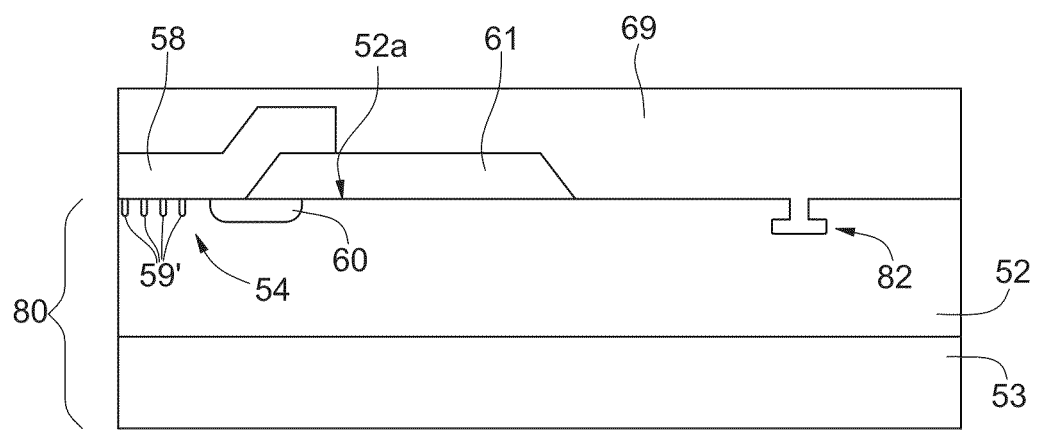

With reference to FIG. 4H, the passivation layer 69 is then formed: the polymeric material is applied on the semiconductor body 80 and distributed through spinning over the anode metallization 58, the insulating layer 61 and the exposed portion of the drift layer 52, and a thermal process is subsequently carried out so that the polymeric material will harden to form the passivation layer 69 (curing process). In particular, during the spinning step the polymeric material penetrates into the cavity 83 and fills it, thus forming the anchorage element 82.

Next, a step of grinding (not shown) of the substrate 53 is carried out on the surface 53b so as to reduce the thickness of the substrate 53. For instance, at the end of the grinding step the substrate 53 has a thickness, measured along the axis Z between the surfaces 53a and 53b, comprised between 100 µm and 250 µm, and in particular of approximately 180 µm. The ohmic-contact layer 56 starting from the surface 53b of the substrate 53, and the cathode metallization 57 starting from the ohmic-contact layer 56, are then formed according to known techniques and in succession with respect to one another, thus obtaining the MPS device 50 shown in FIG. 1.

From an examination of the features of the disclosure provided according to the present disclosure, the advantages that it affords are evident.

In particular, the anchorage element 82 guarantees adhesion of the passivation layer 69 to the semiconductor body 80. In this way, it is possible to make the passivation layer 69 of polymeric materials, thus guaranteeing the high levels of electrical performance of the electronic device 50 (due to the high dielectric strength of the passivation layer 69) and, at the same time, eliminating the risk of delamination of the passivation layer 69 following upon thermal cycles or use of the electronic device 50.

Consequently, the risk of damage to the electronic device 50 following upon electrical discharges between metallizations set at different potentials (e.g., between the EQR metallization 75 and the anode metallization 58) is prevented, and therefore the reliability of the electronic device 50 is increased, in particular when it is subjected to high temperature variations and operated in a reverse-biasing condition.

In particular, the manufacturing steps described with reference to FIGS. 4A-4H make it possible to provide the electronic device 50 comprising the anchorage element 82 starting from an SiC wafer.

In addition, the etch carried out with reference to FIG. 4G is of an isotropic type, and this makes it possible to pattern the cavity 83 and the anchorage element 82 without any limitations deriving from anisotropic etching processes and from the crystallographic orientation of the SiC wafer from which the electronic device 50 is obtained.

Finally, it is clear that modifications and variations may be made to the disclosure described and illustrated herein, without thereby departing from the scope of the present disclosure.

In particular, even though the EQR metallization 75 has been described with reference to FIG. 2, it may likewise be present also in the embodiment of the MPS device 50 shown in FIG. 1.

In addition, the SiC-based electronic device 50 may not be of the MPS type as described previously; in particular, it may comprise at least one from among: a Schottky diode, a PN diode, a SiC-based MOSFET, a SiC-based IGBT, and a SiC-based power electronic element. The anchorage element 82 is arranged on the outside of an area of extension of said power device (e.g., on the outside of the active area 54 in the plane XY) so as to guarantee adhesion of the passivation layer 69 at the power device.

A manufacturing method of an anchorage element (82) of a passivation layer (69) of an electronic device (50) may be summarized as including arranging a semiconductor body (80) of silicon carbide, SiC; forming, in the semiconductor body (80) and at a distance from a top surface (52a) of the semiconductor body (80), a first implanted region (84) having, parallelly to a first axis (X), a maximum dimension having a first value ($d_1$); forming, in the semiconductor body (80), a second implanted region (85), which is superimposed, parallelly to a second axis (Z) orthogonal to the first axis (X), to the first implanted region (84), extends from the top surface (52a) to the first implanted region (84), and has, parallelly to the first axis (X), a respective maximum dimension having a second value ($d_2$) smaller than the first value ($d_1$); carrying out a process of thermal oxidation of the first (84) and of the second (85) implanted regions to form an oxidized region (86') at the first (84) and the second (85) implanted regions; removing said oxidized region (86') to form, in the semiconductor body (80) and at the oxidized region (86'), a cavity (83); and forming, on the top surface (52a), the passivation layer (69) protruding into the cavity (83) to form said anchorage element (82) fixing the passivation layer (69) to the semiconductor body (80).

The step of forming the first implanted region (84) may include forming, at the top surface (52a) of the semiconductor body (80), a first hard mask (71) exposing a first region (71') of the top surface (52a), the first region (71') having, parallelly to the first axis (X), a first maximum width (11); and carrying out a first implantation of dopant species in the semiconductor body (80), at said first region (71'), so as to form the first implanted region (84).

The step of carrying out the first implantation may include carrying out one or more implantations of said dopant species, with an implantation energy comprised between 200 keV and 500 keV and with doses comprised between $1 \cdot 10^{12}$ at/cm$^2$ and $1 \cdot 10^{16}$ at/cm$^2$.

The step of forming the second implanted region (85) may include forming, at the top surface (52a) of the semiconductor body (80), a second hard mask (72) exposing a second region (72') of the top surface (52a), the second region (72') being superimposed, parallelly to the second axis (Z), to the first implanted region (84) and having, parallelly to the first axis (X), a second maximum width (12) smaller than the first maximum width (11); and carrying out a second implantation of the dopant species in the semiconductor body (80), at said second region (72'), so as to form the second implanted region (85).

The step of carrying out the second implantation may include carrying out one or more further implantations of the dopant species, with implantation energy comprised between 30 keV and 200 keV and with doses comprised between $1 \cdot 10^{12}$ at/cm$^2$ and $1 \cdot 10^{16}$ at/cm$^2$.

The step of removing the oxidized region (86') may include carrying out an isotropic etching of the oxidized region (86').

The manufacturing method may further include forming, in the semiconductor body (80) and at a distance from the top surface (52a), at least one third implanted region (82c; 82d) so that the first (84) and the second (85) implanted regions are interposed, parallelly to the second axis (Z), between the at least one third implanted region (82c; 82d) and the top surface (52a) and so that the first implanted region (84) is in contact with the at least one third implanted region (82c; 82d) having, parallelly to the first axis (X), a respective maximum dimension having a third value ($d_3$; $d_4$) greater than the first value ($d_1$) and the second value ($d_2$).

The step of carrying out the process of thermal oxidation may include thermally oxidizing the first (84), the second (85) and the at least one third (82c; 82d) implanted regions to form the oxidized region (86') at the first (84), the second (85) and the at least one third (82c; 82d) implanted regions.

The step of forming a passivation layer (69) may include depositing polymeric material on the top surface (52a).

An anchorage element (82) of a passivation layer (69) of an electronic device (50) including a semiconductor body (80) of silicon carbide, SiC, and said passivation layer (69), which extends on a top surface (52a) of the semiconductor body (80) and protrudes into a cavity (83) of the semiconductor body (80), at the top surface (52a), to form said anchorage element (82), may be summarized as including a first portion (82a), which extends in the semiconductor body (80) at a distance from the top surface (52a) and has, parallelly to a first axis (X), a maximum dimension having a first value ($d_1$); and a second portion (82b), which is superimposed, parallelly to a second axis (Z) orthogonal to the first axis (X), to the first portion (82a), extends in the semiconductor body (80) from the top surface (52a) to the first portion (82a) and has, parallelly to the first axis (X), a respective maximum dimension having a second value ($d_2$)

smaller than the first value ($d_1$), so that the anchorage element (82) fixes the passivation layer (69) to the semiconductor body (80).

An anchorage element (82) may further include at least one third implanted region (82*c*; 82*d*) extending in the semiconductor body (80) and at a distance from the top surface (52*a*), so that the first (84) and the second (85) implanted regions are interposed, parallelly to the second axis (Z), between the at least one third implanted region (82*c*; 82*d*) and the top surface (52*a*) and so that the first implanted region (84) is in contact with the at least one third implanted region (82*c*; 82*d*) having, parallelly to the first axis (X), a respective maximum dimension having a third value ($d_3$; $d_4$) greater than the first ($d_1$) and the second ($d_2$) values.

An annular type may be at the top surface (52*a*) of the semiconductor body (80) and defining a closed polygonal-shape.

The passivation layer (69) may protrude in at least a further cavity (83) of the semiconductor body (80), at the top surface (52*a*), to form, for each further cavity (83) a respective further anchorage element (82), which fixes the passivation layer (69) to the semiconductor body (80) and may include a further first portion (82*a*), which extends in the semiconductor body (80) at a distance from the top surface (52*a*) and has, parallelly to the first axis (X), a respective maximum dimension having the first value ($d_1$); and a further second portion (82*b*), which is superimposed, parallelly to the second axis (Z), to the further first portion (82*a*), extends in the semiconductor body (80) from the top surface (52*a*) to the further first portion (82*a*) and has, parallelly to the first axis (X), a respective maximum dimension having the second value ($d_2$), and wherein the anchorage element (82) and the at least one further anchorage element (82) extend at a distance from one another at the top surface (52*a*) of the semiconductor body (80).

An electronic device (50) may be summarized as including a semiconductor body (80) of silicon carbide, SiC; and a passivation layer (69), which extends over a top surface (52*a*) of the semiconductor body (80) and protrudes into a cavity (83) of the semiconductor body (80), at the top surface (52*a*), to form an anchorage element (82) fixing the passivation layer (69) to the semiconductor body (80), the anchorage element (82) including a first portion (82*a*), which extends in the semiconductor body (80) at a distance from the top surface (52*a*) and has, parallelly to a first axis (X), a maximum dimension having a first value ($d_1$); and a second portion (82*b*), which is superimposed, parallelly to a second axis (Z) orthogonal to the first axis (X), to the first portion (82*a*), extends in the semiconductor body (80) from the top surface (52*a*) to the first portion (82*a*) and has, parallelly to the first axis (X), a respective maximum dimension having a second value ($d_2$) smaller than the first value ($d_1$).

The cavity (83) may be externally delimited by a wall (83*a*) of the semiconductor body (80), having a shape complementary to a shape of the anchorage element (82) so that the anchorage element (82) may be fixed by interlocking in the semiconductor body (80) at the cavity (83).

The merged-PiN-Schottky, MPS, type, wherein the semiconductor body (80) may include an SiC substrate (53) having a first conductivity and a drift layer (52) of SiC extending over the substrate (53) and having the first conductivity and said top surface (52*a*) opposite to the substrate (53), the electronic device (50) further including at least one first doped region (59'), which has a second conductivity opposite to the first conductivity and extends in the drift layer (52), at the top surface (52*a*) of the drift layer (52), so as to form at least one respective junction-barrier, JB, diode, (59) with the drift layer (52); a first electrical terminal (58) in ohmic contact with a respective first surface (59*a*) of the at least one first doped region (59'), coplanar with the top surface (52*a*) of the drift layer (52), and further in direct electrical contact with the top surface (52*a*) of the drift layer (52) alongside the first doped region (59') so as to form a Schottky diode (62) with the drift layer (52); and a second electrical terminal (57, 56) in ohmic contact with a rear side (53*b*) of the substrate (53), opposite to the drift layer (52), wherein the JB diode (59) and the Schottky diode (62) alternate with one another, at the first electrical terminal (58), along the first axis (X).

The anchorage element (82) may be of an annular type at the top surface (52*a*) of the semiconductor body (80), may define a closed polygonal-shape, and may surround the first electrical terminal (58).

The passivation layer (69) may protrude in at least one further cavity (83) of the semiconductor body (80), at the top surface (52*a*), to form, for each further cavity (83), a respective further anchorage element (82) that fixes the passivation layer (69) to the semiconductor body (80) and may include a further first portion (82*a*), which extends in the semiconductor body (80) at a distance from the top surface (52*a*) and has, parallelly to the first axis (X), a respective maximum dimension having the first value ($d_1$); and a further second portion (82*b*), which is superimposed, parallelly to the second axis (Z), to the further first portion (82*a*), extends in the semiconductor body (80) from the top surface (52*a*) to the further first portion (82*a*), and has, parallelly to the first axis (X), a respective maximum dimension having the second value ($d_2$), wherein the anchorage element (82) and the at least one further anchorage element (82) extend at a distance from one another at the top surface (52*a*) of the semiconductor body (80).

The electronic device (50) may include at least one from among: a Schottky diode; a PN diode; a SiC-based MOSFET; and a SiC-based IGBT.

An electronic apparatus may include an electronic device (50).

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
   forming, in a semiconductor body at a first distance from a first surface of the semiconductor body in a first direction transverse to the first surface, a first implanted region having a first dimension in a second direction transverse to the first direction;
   forming, in the semiconductor body, a second implanted region being superimposed to the first implanted region, extending from the first surface to the first implanted region, and having a second dimension in the second direction and smaller than the first dimension;

forming, in the semiconductor body and at a second distance from the first surface, at least one third implanted region so that the first and the second implanted regions are interposed between the at least one third implanted region and the first surface in the first direction, the first implanted region is in contact with the at least one third implanted region, and the at least one third implanted region having a third dimension in the second direction greater than the first dimension and the second dimension;

forming an oxidized region at the first implanted region, the second implanted region, and the third implanted region by performing a thermal oxidation of the first implanted region, the second implanted region, and the third implanted region;

forming a cavity by removing said oxidized region in the semiconductor body; and forming, on the first surface, a passivation layer in the cavity an anchorage element of the passivation layer fixing the passivation layer to the semiconductor body.

2. The method according to claim 1, wherein forming the first implanted region comprises:

forming, at the first surface of the semiconductor body, a first hard mask exposing a first region of the first surface, the first region having a third dimension in the second direction; and forming the first implanted region by performing a first implantation of dopant species in the semiconductor body, at the first region.

3. The method according to claim 2, wherein performing the first implantation comprises performing one or more implantations of the dopant species, with an implantation energy comprised between 200 keV and 500 keV and with doses comprised between $1 \cdot 10^{12}$ at/cm$^2$ and $1 \cdot 10^{16}$ at/cm$^2$.

4. The method according to claim 2, wherein forming the second implanted region comprises:

forming, at the first surface of the semiconductor body, a second hard mask exposing a second region of the first surface, the second region being superimposed to the first implanted region and having a fourth dimension in the second direction and smaller than the third dimension; and forming the second implanted region by performing a second implantation of a dopant species in the semiconductor body at said second region.

5. The method according to claim 4, wherein performing the second implantation comprises performing one or more further implantations of the dopant species, with implantation energy comprised between 30 keV and 200 keV and with doses comprised between $1 \cdot 10^{12}$ at/cm$^2$ and $1 \cdot 10^{16}$ at/cm$^2$.

6. The method according to claim 1, wherein removing the oxidized region comprises performing an isotropic etching of the oxidized region.

7. The method according to claim 1, wherein performing the thermal oxidation comprises forming the oxidized region at the first, the second and the at least one third implanted regions by thermally oxidizing the first, the second and the at least one third implanted regions.

8. The method according to claim 1, wherein forming the passivation layer comprises depositing polymeric material on the first surface.

9. The method of claim 1, further comprising forming a metallization layer on the semiconductor body.

10. The method of claim 9, wherein forming the passivation layer further includes forming the passivation layer on the metallization layer.

11. A method, comprising:

forming a first hard mask on a surface of a drift layer, the first hard mask including a first opening exposing a first region of the drift layer;

forming a first implanted region at a first depth within the drift layer by exposing the first hard mask and the first region of the drift layer exposed by the first opening in the first hard mask layer to one or more implantations of dopant species with an implantation energy between 200 keV and 500 keV and with doses between $1 \cdot 10^{12}$ at/cm$^2$ and $1 \cdot 10^{16}$ at/cm$^2$; and after forming the first implanted region, removing the first hard mask from the surface of the drift layer;

after removing the first hard mask from the surface of the drift layer, forming a second hard mask on the surface of the drift layer with a second opening exposing a second region of the drift layer aligned with the first implantation region;

forming a second implanted region at a second depth less than the first depth within the drift layer by exposing the second hard mask and the second region of the drift layer exposed by the second opening in the second hard mask to one or more implantations of dopant species with an implantation energy between 30 keV and 200 keV and with doses between $1 \cdot 10^{12}$ at/cm$^2$ and $1 \cdot 10^{16}$ at/cm$^2$;

after forming the second implanted region, removing the second hard mask from the surface of the drift layer; and thermally oxidizing the first and second implanted regions.

12. The method of claim 11, further comprising removing a first portion of the second hard mask to expose a third region of the surface of the drift layer.

13. The method of claim 12, wherein exposing the third region of the surface of the drift layer includes exposing one or more doped regions present along the surface of the drift layer.

14. The method of claim 13, further comprising forming a metallization on the third region of the drift layer, on the second hard mask, and on the one or more doped regions.

15. The method of claim 14, wherein, after forming the metallization, removing a second portion of the second hard mask and removing the first implanted region and the second implanted region previously thermally oxidized forming a cavity corresponding to the first implanted region and the second implanted region.

16. The method of claim 15, further comprising forming a passivation layer on the metallization, on a third portion of the second hard mask remaining on the surface of the drift layer, on the surface of the drift layer, and in the cavity.

17. A method, comprising:

forming first hard mask on a surface of a drift layer, the first hard mask including a first opening exposing a first region of the drift layer;

forming a first implanted region at a first depth within the drift layer by exposing the first hard mask and the first region to one or more first implantations of dopant species;

removing the first hard mask from the surface of the drift layer;

forming a second hard mask on the surface of the drift layer, the second hard mask includes a second opening exposing a second region of the drift layer, the second region aligned with the first implanted region;

forming a second implanted region at a second depth within the drift layer different than the first depth within the drift layer by exposing the second hard mask and the second region to one or more second implantations of dopant species;

removing the second hard mask layer;

forming a third hard mask on the surface of the drift layer, the third hard mask includes a third opening exposing a third region of the drift layer, the third region aligned with the first implanted region and the second implanted region; and forming third implanted region at a third depth within the drift layer different than the first depth and the second depth within the drift layer by exposing the third hard mask and the third region to one or more third implantations of dopant species; and thermally oxidizing the first, second, and third implanted regions.

18. The method of claim 17, further comprising removing a first portion of the third hard mask to expose a fourth region of the surface of the drift layer.

19. The method of claim 18, wherein exposing the fourth region of the surface of the drift layer includes exposing one or more doped regions present along the surface of the drift layer.

20. The method of claim 19, further comprising forming a metallization on the fourth region of the drift layer, on the third hard mask, and on the one or more doped regions.

* * * * *